United States Patent
Call et al.

(10) Patent No.: US 7,256,140 B2
(45) Date of Patent: Aug. 14, 2007

(54) HIGHER SELECTIVITY, METHOD FOR PASSIVATING SHORT CIRCUIT CURRENT PATHS IN SEMICONDUCTOR DEVICES

(75) Inventors: Jonathan Call, Royal Oak, MI (US); Greg DeMaggio, Ann Arbor, MI (US); Ginger Pietka, Harrison Township, MI (US)

(73) Assignee: United Solar Ovonic LLC, Auburn Hills, MI (US)

( * ) Notice: Subject to any disclaimer, the term of this patent is extended or adjusted under 35 U.S.C. 154(b) by 132 days.

(21) Appl. No.: 11/231,031

(22) Filed: Sep. 20, 2005

(65) Prior Publication Data

US 2007/0065992 A1   Mar. 22, 2007

(51) Int. Cl.
*H01L 21/31* (2006.01)
*H01L 21/326* (2006.01)

(52) U.S. Cl. ............ 438/758; 438/466; 257/E21.56
(58) Field of Classification Search ........ 438/758, 438/466; 257/E21.56
See application file for complete search history.

(56) References Cited

U.S. PATENT DOCUMENTS

2005/0011550 A1*   1/2005   Chittibabu et al. ......... 136/243

* cited by examiner

*Primary Examiner*—Scott B. Geyer
*Assistant Examiner*—Elias Ullah
(74) *Attorney, Agent, or Firm*—David W. Schumaker

(57) ABSTRACT

Certain modifications and additions to the prior art short passivation technique have lead to improvements in the low light voltage of solar cells which are made using the improved passivation technique. Examples of the modifications include:

1) reducing the voltage bias on the cell while increasing the time of application of the voltage;
2) reversing the polarity of the voltage bias on the devices;
3) alternating pulsing between forward and reverse polarity bias; or
4) applying light energy simultaneously with an electrical bias voltage.

21 Claims, 4 Drawing Sheets

HIGHER SELECTIVITY, METHOD FOR PASSIVATING SHORT CIRCUIT CURRENT PATHS IN SEMICONDUCTOR DEVICES

FIELD OF THE INVENTION

The instant invention relates generally to passivation of short circuit current paths within thin film semiconductor devices. More specifically this application relates to improvements in the passivation of short circuit current paths by the electrochemical modification of portions of a conductive electrode adjacent to the short circuit pathways. Most specifically, the present invention relates to methods which more selectively converts smaller regions of the electrically conductive electrode, thereby reducing the loss of non-shorted regions of the semiconductor devices.

BACKGROUND OF THE INVENTION

Thin film semiconductor materials offer several distinct advantages over crystalline materials, insofar as they can be easily and economically fabricated into a variety of devices by mass production processes. However, in the fabrication of thin film electronic devices such as photovoltaic devices, the presence of current-shunting, short circuit defects has been observed. These defects have (1) seriously impaired the performance of the electronic devices fabricated therefrom and (2) detrimentally affected production yield. These process-related defects are thought to either be present in the morphology of the substrate or electrode; or develop during the deposition or subsequent processing of the intermediate semiconductor, dielectric or superconducting layers. Eliminating, or at least substantially reducing the effects of these current-shunting defects has been the focus of much research.

The most important of these defects may be characterized as shunts, short-circuits, defect regions or low resistance current paths, such terms being employed interchangeably herein. Before the suspected causes of these defects are explained, it is helpful to note the typical thicknesses of the deposited intermediate layers. For example, in a p-i-n type electronic device, a typical "p" layer may be only on the order of 250 angstroms thick, a typical "i" layer may be only on the order of 3,500 angstroms thick, and a typical "n" layer may be only on the order of 250 angstroms thick, thereby providing a total semiconductor body thickness of only about 4,000 angstroms. It should therefore be appreciated that irregularities, however, small, are not easy to cover by the deposited semiconductor layers.

Shunt defects are present when one or more low resistance current paths develop through the intermediate body of the device allowing current to pass unimpeded between the electrodes thereof. Under operating conditions, a photovoltaic device in which a shunt defect has developed, exhibits either (1) a low power output, since electrical current collected at the electrodes flows through the defect region (the path of least resistance) in preference to an external load, or (2) complete failure where sufficient current is shunted through the defect region to "burn out" the device. Similarly, in thin film electronic resistive devices current is either shunted through the defect region resulting in severely degraded performance of the device, or the defect results in total, complete failure of the device.

While shunt-type defects always deleteriously affect the performance of electronic devices, their effect is particularly profound in photovoltaic devices which are operated under relatively low illumination, such as room light, vis-a-vis, high intensity illumination such as an AM-1 solar spectrum. Under room light illumination, the load resistance of the cell (i.e., the resistance under which the cell is designed to operate most efficiently) is comparable to the shunt resistance (i.e., the internal resistance imposed by the defect regions), whereas under AM-1 illumination, the load resistance is much lower by comparison. Furthermore, in a photovoltaic device, photogenerated current increases linearly with increasing illumination, while the resulting voltage increases exponentially. In other words, voltage attains a relatively high value under low illumination, the value increasing only slightly as the intensity of the illumination is increased. The result is that under low illumination the relatively high voltage potential present preferentially drives the relatively small number of photogenerated current carriers through the path of least resistance, i.e., the low resistance defect regions. In contrast thereto, under high illumination, a large number of current carriers are present and are driven by a potential of about the same magnitude as the potential which exists under low illumination. This larger number of current carriers compete for a limited number of least resistance paths (through the defect regions). The result is that at high intensity, while more power may be lost to the defect region, the power lost is a smaller percentage of the total power produced than at low intensity illumination.

Defects or defect regions, the terms being interchangeably used herein, are not limited to "overt" or "patent" short circuit current paths. In some cases, the adverse effects of a defect are latent and do not immediately manifest themselves. Latent defects can give rise to what will be referred to hereinafter as an "operational mode failure", wherein an electronic, or other semiconductor device, initially exhibiting satisfactory electrical performance, suddenly fails. This type of failure will be discussed in further detail hereinbelow. It is believed the shunt defects, both latent and patent, arise from one or more irregularities in the (1) morphology of the substrate material, (2) in the growth of the intermediate semiconductor layers or (3) unintended inclusions within the deposited layers.

The first, and perhaps most important, source of the defects, i.e., the aforementioned morphological irregularities in the deposition surface of the substrate material will now be discussed. Even though the highest quality sheet glass or stainless steel is employed to serve as the substrate upon which the conductive base electrode (either transparent oxide or metallic) upon which the intermediate semiconductor layers and the overlying metallic electrode are successively deposited, it has been calculated that from 10,000 to 100,000 irregularities per square centimeter are present on the deposition surface thereof. Such irregularities take the form of projections, craters, or other deviations from a smooth finish and may be under a micron in: 1) depth below the surface; 2) height above the surface; or 3) diameter. Regardless of their configuration or size, such defects may establish a low resistance current path through the intermediate semiconductor body, thereby effectively short-circuiting the two electrodes. This may occur in numerous ways. For instance, a spike projecting from the surface of the base electrode may be of too great a height to be covered by the subsequent deposition of semiconductor layers and therefore, be in direct electrical contact with the overlying metallic electrode when said electrode is deposited atop the intermediate semiconductor layers. Likewise, a crater formed in the surface of the substrate may be of too small a size to be filled by the subsequent deposition of the base electrode and semiconductor layers and therefore, be in sufficient proximity to the other electrode, when that electrode is deposited atop the semiconductor layers. In such an instance: 1) electrical current may bridge the gap which exists between the electrodes; or 2) during actual use of the electronic device, the material of one of the electrodes may, under the influence of the electrical field, migrate toward and contact the other of the electrodes, so as to pass electrical current therebetween and thereby give rise to an operational mode failure. It is also possible that in some cases the intermediate layers deposited onto the substrate or base electrode include regions of irregular composition which can provide low resistance paths for the flow of electrical current between the electrodes of the photovoltaic device.

Further, despite efforts to maintain a deposition vacuum envelope free of external contaminants, dust and other particulate matter may either invade the vacuum envelope during the deposition of the intermediate layer material, or forms as a by-product of the deposition process, which are deposited over the substrate electrode along with the semiconductor material. Such contaminants interfere with the uniform deposition of the intermediate layers and may establish low resistance current paths therethrough.

Additionally, it is suspected that in some cases, the intermediate materials form micro-craters or micro-projections during the deposition thereof, (even absent the presence of contaminants or external pollutants). Such morphological deviation from a perfectly smooth and even surface means that the substrate is covered by either: 1) an ultra-thin layer of material; or 2) not at all. Obviously, when the overlying metallic electrode material is deposited across the entire surface of the semiconductor body, the thin or open regions thereof create a low resistance current path. In still other cases, the presence of defect regions is only detectable by their deleterious effect upon the electrical and/or photoelectric properties of the resultant device.

In some instances, particular types of electronics devices may operate adequately in spite of the presence of such defects; however other devices, are significantly impaired in function by defects therein. While the defects described herein above may, in some instances, not be sufficiently severe to divert all electrical current through the low resistance path, the diversion or shunting of any current therethrough results in some loss in operational efficiency of the electronic device. Moreover, the shunting of even small amounts of current through each of thousands of defect regions will aggregate to cause major losses in efficiency. Based upon the foregoing, it should be apparent that a reduction in the number of defect regions is critical to the fabrication of high-yield, high efficiency, large area, thin film electronic devices.

Several approaches for dealing with this problem have been implemented in the past. As described in U.S. Pat. Nos. 4,451,970,; 4,464,823; 4,510,674 and 4,510,675 of Masatsugu Izu and Vincent Cannella, the disclosures of which are incorporated herein by reference, the shunting of current through defect regions may be cured by substantially eliminating the defect regions as an operative area of the electronic device. This is accomplished in an electrolytic process wherein electrode material (in the preferred embodiment, indium tin oxide) is physically removed from the periphery of the defect site, effectively isolating the defect regions and preventing the flow of electrical current from the defect region into the electrode layer. As disclosed in U.S. Pat. No. 4,385,971 of Swartz, defect regions in a solar cell are electrolytically removed in a process which either etches, or bubble-blasts defective semiconductor regions from the solar cell, so as to physically remove material therefrom.

However, in those instances where a current collecting structure such as a busbar system or a grid pattern is subsequently applied to the device, care must be taken in utilizing the aforedescribed processes so as to avoid having such conductive structure electrically contact the isolated defect, to avoid creating another short circuit. Consequently, insulating material is generally applied to the isolated regions. In U.S. Pat. No. 4,419,530 of Prem Nath, the disclosure of which is also incorporated herein by reference; there is described a method for electrically isolating defect containing small area segments of an amorphous, thin film, large area photovoltaic device. This isolation of defects is accomplished by: 1) dividing the large area device into a plurality of small area segments; 2) testing the small area segments for electrical operability; and 3) electrically connecting only those small area segments exhibiting a predetermined level of electrical operability, whereby a large area photovoltaic device comprising only electrically operative small area segments is formed.

While the method of Nath is effective in reducing or eliminating the effect of shunts, it is not completely satisfactory for several reasons. The step of dividing the semiconductor body into electrically isolated portions requires several production steps and also reduces the total area of the device. Further, the method can be time and cost intensive since the electrical output of each isolated portion must be individually tested and separate electrical connections must be made to provide electrical contact thereto. Also, since an entire segment is effectively eliminated from the final cell if it manifests a defect, losses of efficiency are greater than they would be if only the precise area of the particular defect were eliminated.

Further, U.S. Pat. No. 4,598,306 of Nath, et al., the disclosure of which is incorporated herein by reference, discloses the use of a resistive barrier layer interposed between the semiconductor body and one of the electrodes of a semiconductor device for limiting the amount of electrical current that can flow through defect regions. In this manner, the relatively large short circuit current flowing through defect regions is buffered by the current limiting resistance of the layer. While the foregoing method does improve the production yield of usable semiconductor devices, it interposes an additional series resistance therein, which resistance decreases the operational efficiency of the device.

Additionally, U.S. Pat. Nos. 4,590,317 and 4,633,033, the disclosures of which are incorporated herein, teach the use of various current collecting bus grid structures for the purpose of restricting short circuit current flow in semiconductor devices. According to the teachings therein, the current carrying capacity of grid systems of devices may be effectively restricted through the use of proper geometry, and/or materials. The limited current carrying capacity of such current collecting grids functions to buffer the effects of short circuit current flows through defect regions proximate thereto. While this system does significantly improve device yield, it obviously is of no use for semiconductor devices which do not include a current collecting grid structure therein; additionally, such grid structures, themselves, add some additional series resistance to the device.

Finally, U.S. Pat. Nos. 4,729,970 and 5,084,400, the disclosures of which are incorporated herein by reference, teach a methods of passivating short circuit defects in electronic devices having conductive electrodes. The '970 patent also teaches passivation of thin film electronic devices by employing either Lewis Acids or salts of amphoteric elements as the conversion reagents for passivation purposes. These disclosures teach passivation of current shunting circuit defects by reducing the conductive oxide electrode or metallic electrode, proximate the defect regions, to insulating materials.

In the past, techniques such as those disclosed in U.S. Pat. No. 4,729,970 ('970) have been sufficient to improve the yield of photovoltaic devices continuously deposited on elongated webs of stainless steel. However, as the instant assignee's technology for deposition of photovoltaic devices on elongated webs has advanced, the length of the webs on which the devices are deposited has become increasingly long. This means that the deposition chambers are in use longer between web changes and there is less down time. This is advantageous in that less down time means higher productivity and higher overall output for any give production machine. Unfortunately, a problem has developed. As the length of the web increases, the length of use of the deposition chambers also increases, and the chamber is purged/cleaned less often, resulting in an increased amount of particulate in the chamber. The inventors have discovered that in long runs, the low light voltage of photovoltaic devices drops off after a certain point in the web, and continues to do so drastically, such that a significant portion of the tail end of the web is unusable for production of saleable photovoltaic devices. Thus, gains in productivity by using longer webs are undercut by loses in saleable yield. FIG. 1 graphs the $V_{LL}$ in millivolts versus the device number for two deposition runs. As can be seen from the run where the devices are passivated by the standard, prior art passivation technique (symbol ♦, 5V for 2 sec.), the higher device number (later in the deposition run) begin to have lower $V_{LL}$, until eventually at about device number 4500 or so, the $V_{LL}$ is below the acceptable limit of 900 mV.

While not wishing to be bound by theory, the instant inventors believe that the falloff of the low light voltage is due to a significant increase in the number of particles formed in the semiconductor deposition chamber (which eventually attach to and are incorporated into the device) as the length of the run is increased. This results in a higher number of shunt defects in the devices. Passivating the cells which have a larger density of short defects in the manner as described in the '970 patent results in decreased low light voltage. To increase the low light voltage, the defects must be more fully isolated. Toward this end, passivation processing time may be increased, but in so doing it has been found that a point is reached where the good area surrounding the defects is converted, resulting in cosmetic defects and a thinner top conducting oxide later. Thus there is a strong felt need in the art for a method of increasing the selectivity of the passivation process to reduce the isolation loss of viable photovoltaic material while still properly passivating the short circuits shunts.

SUMMARY OF THE INVENTION

The present inventors have found that certain modifications and additions to the prior art short passivation technique have lead to improvements in the low light voltage of solar cells which are made using the improved passivation technique. Examples of the modifications include:

1) Reducing the voltage bias on the cell while increasing the time of application of the voltage; the applied voltage is preferably on the order of less than 3.5 volts, more preferably 2.5 to 3.5 volts and most preferably from 2.7 to 3.2 volts. The passivation duration is preferably on the order of greater than 4.5 seconds, more preferably 4.5 to 20 seconds, and most preferably 5.2 to 15 seconds. Generically, applying a voltage which induces current within the device such that the ratio of the current flowing through the defects to the current flowing through the non-defect portions of the device is at least 4:1.

2) Reversing the polarity of the voltage bias on the devices; the polarity of the applied voltage is opposite of that used in production. Standard passivation for production places the device at the negative terminal of the power supply. In this case, the device to be passivated is positive with respect to the counter electrode.

3) Alternating pulsing between forward and reverse polarity bias; the voltage on the device was alternated between −0.6 V and +6 volts. The devices were pulsed at ten pulses per second.

4) Applying light energy simultaneously with an electrical bias voltage; the voltage of the electrical bias and the photo-generated voltage produced by the non-shorted areas of the devices offset each other such that current flow within the good areas of the device is substantially reduced or eliminated, while current continues to flow in the shunted portions of the device. This allows for high selectivity of passivation of the electrode material in contact with the shunted portions of the device while leaving the electrode material connected to the active portions of the device intact.

DETAILED DESCRIPTION OF THE INVENTION

Figure 1:
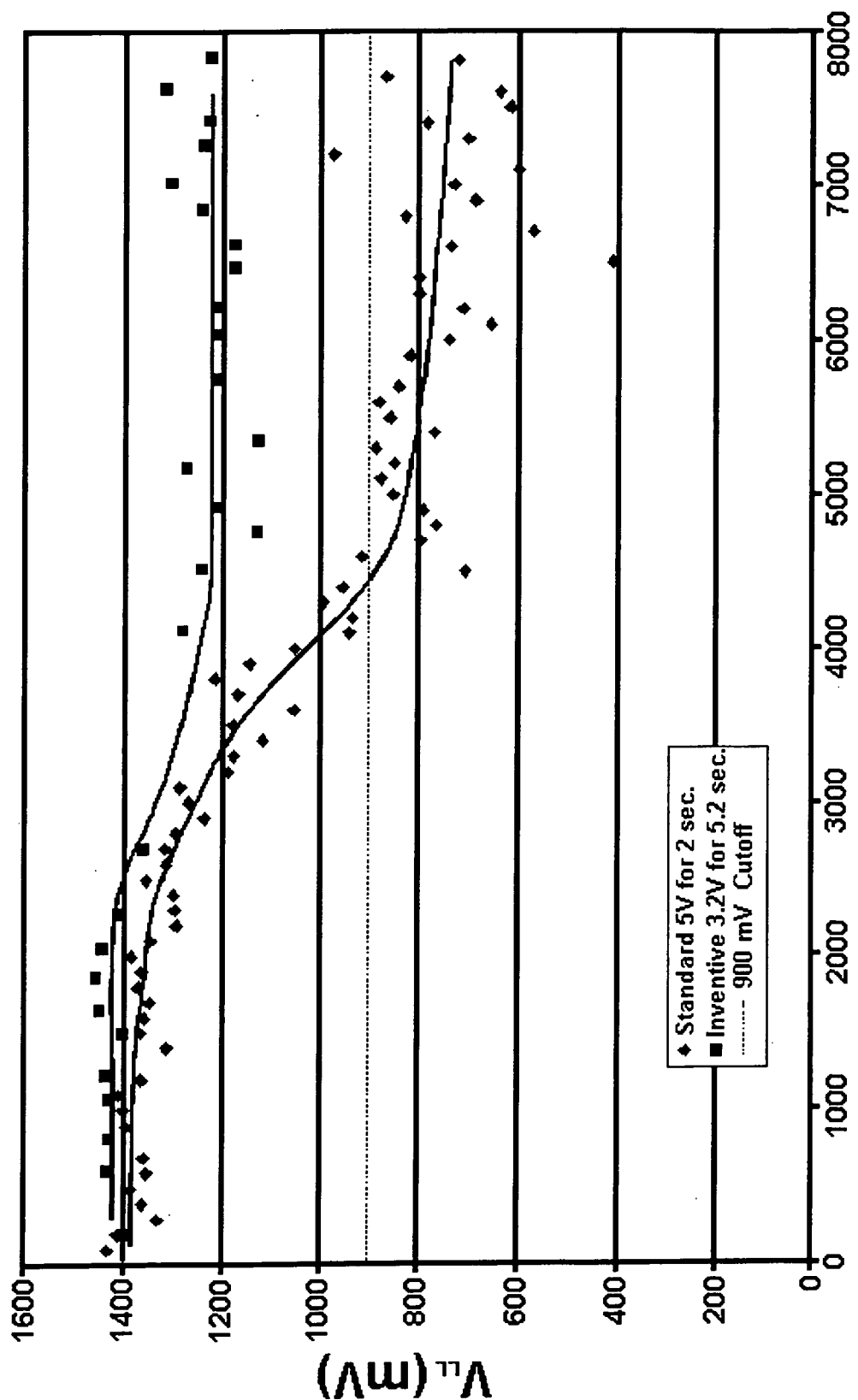
FIG. 1 graphs the $V_{LL}$ in millivolts versus the device number for two deposition runs, one using the prior art passivation technique and one using the and embodiment of the passivation technique of the instant invention.

The instant inventors have discovered that certain modifications and additions to the technique of the '970 patent have lead to improvements in the low light voltage of solar cells which are made using the improved passivation technique. Therefore, in its most generic sense, the instant invention comprises applying electrical and/or light energy to the photovoltaic device (which is immersed in and electrolytic passivation agent) in such as way as to selectively minimize the isolation of non-shorted active semiconductor material from the electrode, while maximizing the isolation of short circuit shunts. To do this the inventors have changed the conditions of the applied energy. Four basic ways of modifying the techniques of the '970 patent that have been found to be successful:

1) reducing the voltage bias on the cell while increasing the time of application of the voltage;
2) reversing the polarity of the voltage bias on the devices;
3) alternating pulsing between forward and reverse polarity bias; or
4) applying light energy simultaneously with an electrical bias voltage.

In general the prior art processing used in production by the instant assignee comprises immersing the photovoltaic device in a passivation agent, adapted to modify the electrically conductive electrode material and thereby isolate the defect regions. In this manner, the defect regions are substantially electrically isolated from the remainder of the electrode.

The specifics passivation agent used in the production process of the prior art include either an aqueous electrolyte solution of $AlCl_3$ or $H_2SO_4$. An activating voltage is applied to the photovoltaic device such that the bottom electrode of the photovoltaic device is connected to the negative electrode and a positive electrode is placed in the electrolyte adjacent the photovoltaic device. The applied voltage is about 5.0 volts and the duration of the voltage/immersion is about 2 seconds.

As has been mentioned above with respect to FIG. 1, the prior art passivation technique has been adequate until recently, when the coil length of the web of deposition substrate was increased from 800 meters to 1700 meters (with aims to increase to 2500 meter runs). This increase in run length has unacceptably decreased the low light voltage ($V_{LL}$) of solar modules produced from a substantial portion of the production run. Thus a good portion of the extended length of the production run has unacceptably low $V_{LL}$. The present modifications of the prior art production passivation techniques improves the $V_{LL}$ of these devices. The new techniques provide for greatly increased yield over the prior art techniques, even and especially at extended length production runs. Typically, the new passivation techniques gives yields greater than about 90% and more specifically greater than about 95% for coil lengths of 1700 meters to 2500 meters and even longer. The prior art passivation technique typically gave about yield of 87% or less on coils of 1200 meters or less.

Reduced Voltage-Increased Time

The present inventors have found that if the applied voltage of passivation is reduced significantly over the prior art production passivation voltage and the duration of application of the lowered voltage is significantly increased over the duration of the prior art production technique, the devices of the latter portion of the production web have increased $V_{LL}$. That is, the inventors have unexpectedly found that increasing the time of passivation, while reducing the voltage of passivation has resulted in higher selectivity of passivation of the shorted portions of the devices over the non-shorted portions (good areas) of the device. This is unexpected in that reduction of voltage with concurrent lengthening of the passivation duration would be expected to merely give the equivalent passivation as higher voltage, shorter duration passivation.

The instant inventors have modified the passivation process for production devices by decreasing the applied voltage from the standard 5.0 volts to 3.2 volts, and have increased the duration of the passivation from 2.0 seconds to 5.2 seconds. This has resulted in a substantial increase in the average $V_{LL}$ of the produced devices. The electrolyte or passivation agent (used herein interchangeably) in both instances was an identical aqueous $H_2SO_4$ solution typically used in assignee's commercial production of photovoltaic devices. Returning to FIG. 1, it can be seen that the passivation technique of this embodiment of the present invention (symbol ■, 3.2V for 5.2 sec) has substantially increased the number of acceptable ($V_{LL}$ above 900 mV) devices. The x-axis of FIG. 1 is 8000 devices, which is equivalent to 1900 meters. The yield for this particular 1900 meter long run with the prior art passivation method is only 59%, whereas with the new recipe it is 100%.

In this embodiment of the modified passivation process of the instant invention, the applied voltage is preferably on the order of less than 3.5 volts, more preferably 2.5 to 3.5 volts and most preferably from 2.7 to 3.2 volts. The passivation duration is preferably on the order of greater than 4.5 seconds, more preferably 4.5 to 20 seconds, and most preferably 5.2 to 15 seconds.

Figure 2A:
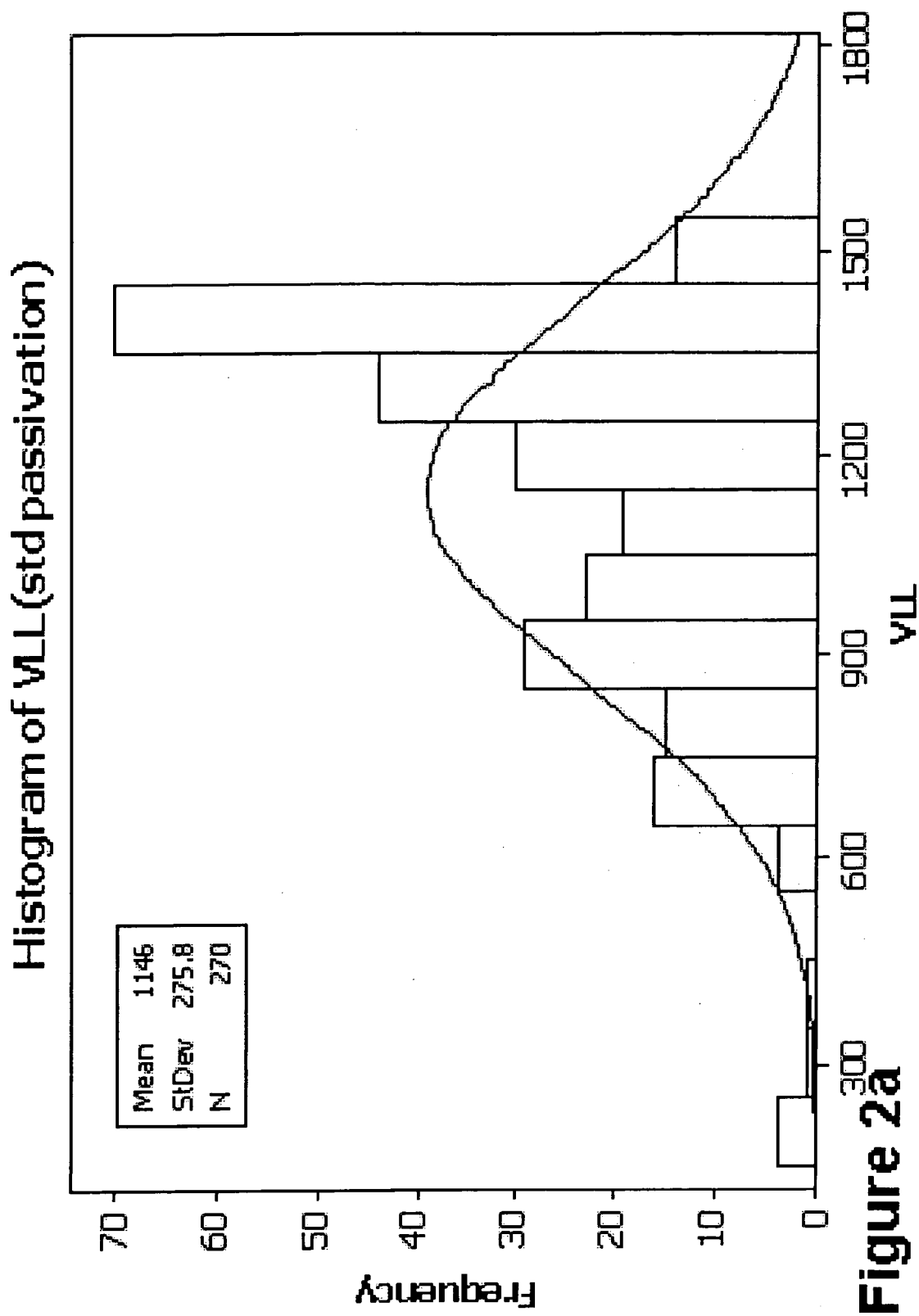
FIGS. 2a and 2b are graphs which plot in bar chart form the number of devices (frequency) versus the $V_{LL}$ range (groups of 100 mV, i.e. 550-650 mV etc.) for the devices made by the standard prior art commercial passivation technique, and an embodiment of the inventive passivation technique, respectively.
Figure 2B:
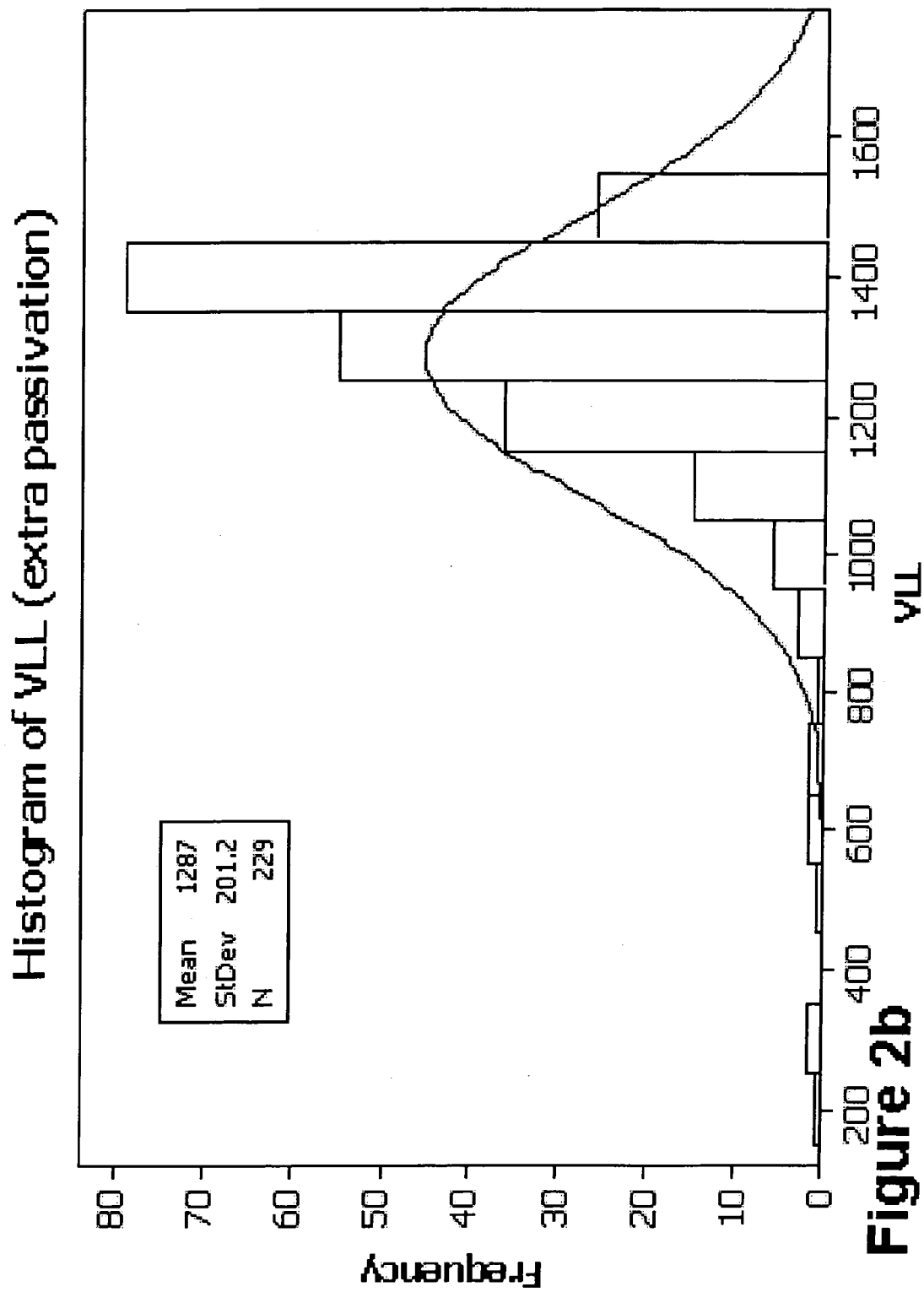

FIGS. 2a and 2b are graphs which plot in bar chart form the number of modules (frequency) versus the $V_{LL}$ range (groups of 100 mV, i.e. 550-650 mV etc.) for the devices made by the standard commercial passivation technique, and this embodiment of the inventive passivation technique, respectively. As can be seen, the mean $V_{LL}$ has increased from 1146 mV for the standard passivation technique to 1287 mV for the inventive passivation technique. Also note that the number of devices below the 1150 to 1250 mV range has been significantly reduced by utilization of the inventive passivation technique.

Figure 3:
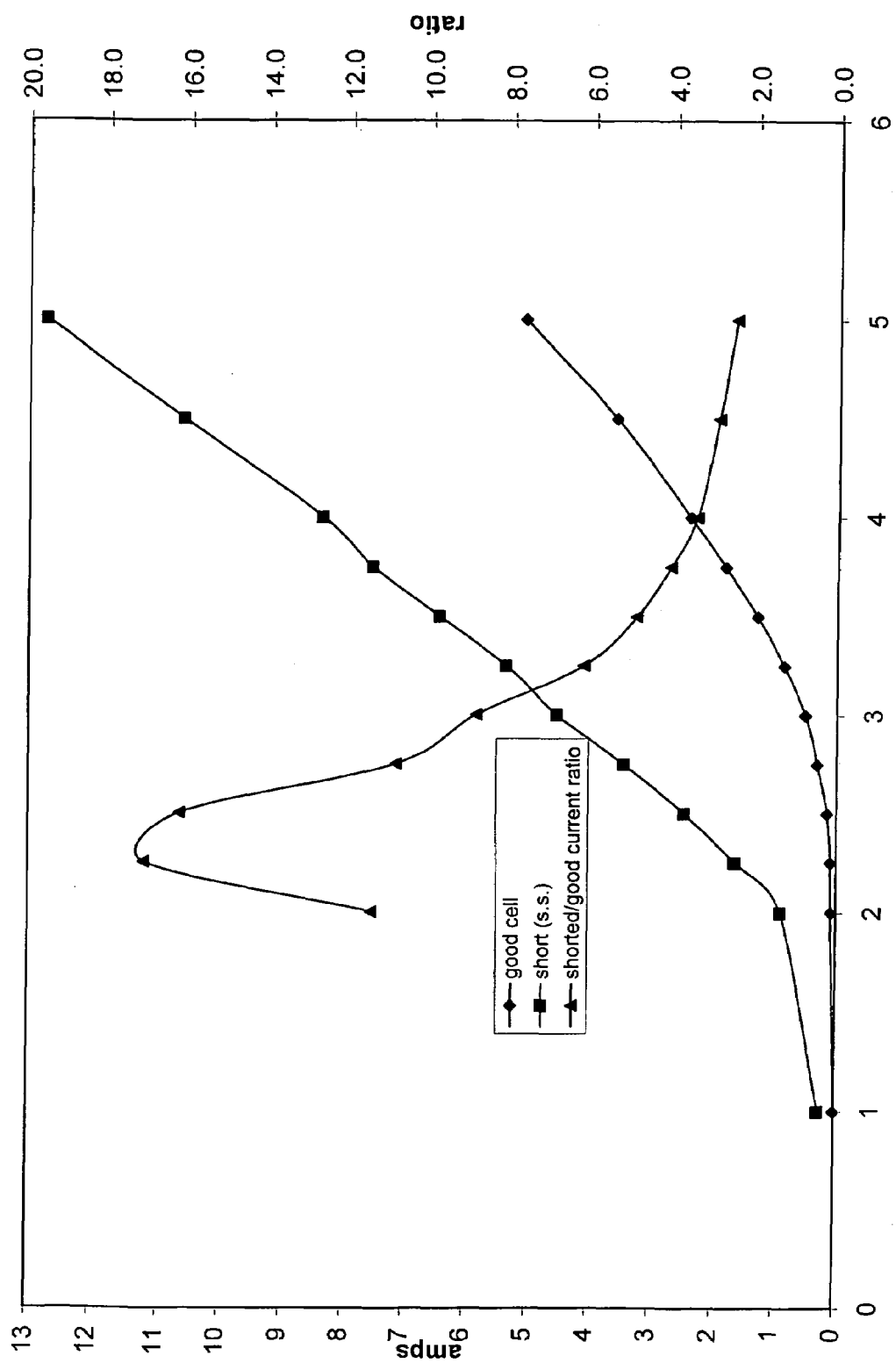
FIG. 3 illustrates plots of I-V curves of photovoltaic devices within a passivation bath.

FIG. 3 plots I-V curves of photovoltaic devices within a passivation bath. The applied voltage across the device is plotted on the x-axis and the induced current is plotted on the y-axis. One curve is for a good, non-shunted device (symbol ◆), another is for a worst case shorted cell (symbol ■). Also plotted is the ratio of the shunted device current to the good device current, versus applied voltage. As can be seen from FIG. 3, the ratio of current across the shunted portion versus the current across the non-shunted portion reaches a maximum around 2.2 volts or so. Physically, this indicates that passivation at this point should create the greatest selectivity between the shunted and non-shunted portions of the device, since the shunted portions have a significantly higher current flowing therethrough. Thus the voltage applied to the device during passivation should be in a range where the ratio of the current passing through the shunted portion of the device to the current passing through the non-shunted portion of the device is significantly high, on the order of 4:1 or greater, more preferably on the order of 6:1 or greater and most preferably on the order of 8:1 or greater.

While actual numerical values are shown in FIG. 3, these numbers are for a specific type of photovoltaic module (triple junction) and a specific passivation system. The specific values for voltage and current can vary from those shown. What is to be gleaned from the information is that there is a regime for any device/system combination where the selectivity of passivation can be enhanced to target the shunted portions of the photovoltaic device. All that is needed is to determine the ratio of the current through the shunted to the current through non-shunted portions of the device at a range of voltages and to plot that ratio versus voltage. Once that is accomplished, one can determine the proper voltage to apply. Then the proper voltage may be applied to the devices for as long as necessary to raise the low light voltage to an acceptable level.

Reverse Polarity

Another embodiment of the instant invention involves reversing the polarity of the applied voltage from that of the prior art while passivating photovoltaic devices. Thus, photovoltaic devices which have been produced late in the deposition run have been passivated in an aqueous solution 1 of $AlCl_3$. The concentration of the $AlCl_3$ was adjusted to give a solution conductivity of 40 millimhos. The polarity of the applied voltage is opposite of that used in production. Standard passivation for production places the device at the negative terminal of the power supply. In this case, the device to be passivated is positive with respect to the counter electrode. The voltage between the device and the counter electrode was set to is 4.0 Volts. The voltage was pulsed at 1 second intervals (50% dwell time) and 20 total pulses were required to achieve low light voltage of 1400 millivolts. Thus, this reverse polarity embodiment of the present invention can also improve the selectivity of the passivation of short circuit shunts over the process of the prior art.

Alternating Foreword/Reverse Pulsing

The inventors have also used alternating forward/reverse voltage pulses to passivate devices which have been produced late in the deposition run. The voltage on the device was alternated between −0.6 V and +6 volts. The devices were pulsed at ten pulses per second. One device was passivated by 125 such pulses and showed a final $V_{LL}$ of 1000 mV. The passivation electrolyte was an aqueous solution of $H_2SO_4$. Thus, the alternating forward/reverse voltage pulses have a significant effect on the selectivity of the passivation of short circuit shunts over the process of the prior art.

Combine Light and Electrical Energy

In this embodiment, both light energy and electrical energy are applied simultaneously to the device. The voltage of the electrical bias and the photo-generated voltage produced by the non-shorted areas of the devices offset each other such that current flow within the good areas of the device is substantially reduced or eliminated, while current continues to flow in the shunted portions of the device. This allows for high selectivity of passivation of the electrode material in contact with the shunted portions of the device while leaving the electrode material connected to the active portions of the device intact. For example, a device is biased with a −2V versus the counter electrode. Simultaneously, light energy is projected onto the photovoltaic device such that the device creates a counter voltage of approximately 2V. This photo-generated counter voltage offsets the applied voltage over the active portions of the device, but does not counter the applied voltage at the shunts. The electrode material over the shunts is selectively passivated, leaving the electrode material over the active area substantially unchanged. This embodiment of the inventive passivation technique has increased the $V_{LL}$'s of shunted devices to between 1000 to 1400 mV.

It should finally be noted that although the instant invention has been described primarily with reference to photovoltaic devices, it can obviously be utilized with any electronic device in which defect regions create short circuit problems. For example, the instant invention may be utilized to passivate defects in devices such as capacitors, photosensors, liquid crystal display devices, diodes, threshold switches, memory devices and various arrays and combinations thereof. It should therefor be recognized that the foregoing examples, description and discussion are merely meant to be illustrative of the principles of the instant invention and not meant to be a limitation upon the practice thereof. It is the following claims, including all equivalents, which are meant to define the scope of the instant invention.

We claim:

1. A method of passivating short circuit defects in a thin film large area photovoltaic module comprising a substrate electrode, an intermediate body including a plurality of continuous layers disposed atop said substrate and selected from the group consisting of dielectrics, semiconductors, and combinations thereof, and a top electrode disposed atop said intermediate body, said method comprising the steps of:

providing a solution of a passivation agent in contact with at least those portions of said electrode proximate said defects; and disposing a counter-electrode in electrical communication with said solution of said passivation agent;

providing a power supply in electrical communication with both said counter-electrode and said substrate electrode of said photovoltaic module for applying a potential between said substrate electrode and said counter-electrode;

applying electrical energy to said electrodes and optionally light energy to said photovoltaic device thereby activating said passivation agent proximate said defects so as to facilitate modification of the electrode material, whereby said defects regions are substantially electrically isolated from the remainder of said electrode material; and controlling the voltage and duration of the application of said electrical energy and, if applied, the intensity and duration of said light energy so as to ensure high selectivity of modification of the electrode material adjacent said defect, while leaving the electrode material adjacent non-defect areas in its unmodified form.

2. The method of claim 1, wherein said selectivity is sufficient to provide a 90% yield of usable photovoltaic devices.

3. The method of claim 1, wherein said step of controlling the voltage and duration of the application of said electrical energy comprises applying a voltage which is lower than that used in the prior art for a longer duration than used in the prior art.

4. The method of claim 3, wherein said voltage is less than about 3.5 volts and said duration is greater than about 4.5 seconds.

5. The method of claim 4, wherein said voltage is less than about 2.5 to 3.5 volts.

6. The method of claim 4, wherein said duration is 4.5 to 20 seconds.

7. The method of claim 4, wherein said voltage is less than about 2.7 to 3.2 volts.

8. The method of claim 4, wherein said duration is 5.2 to 15 seconds.

9. The method of claim 1, wherein said step of controlling the voltage and duration of the application of said electrical energy comprises applying a voltage which is of opposite polarity to that of the prior art, said substrate electrode being at a positive voltage with respect to the counter electrode.

10. The method of claim 9, wherein opposite polarity voltage is about 4 volts.

11. The method of claim 10, wherein opposite polarity voltage was pulsed at 1 second intervals, 50% dwell time) for 20 pulses.

12. The method of claim 1, wherein said step of controlling the voltage and duration of the application of said electrical energy comprises applying pulses of alternating polarity.

13. The method of claim 12, wherein applying pulses of alternating polarity comprises applying pulses that alternate the voltage on the device between −0.6 V and +6 volts.

14. The method of claim 13, wherein said pulses of alternating polarity are applied at ten pulses per second.

15. The method of claim 13, wherein 125 of said pulses of alternating polarity are applied.

16. The method of claim 1, wherein said step of controlling the voltage and duration of the application of said electrical energy and the intensity and duration of said light energy comprises applying both electrical and light energy.

17. The method of claim 16, wherein said step of applying both electrical and light energy comprises applying a electrical energy at a voltage and polarity which is of opposite polarity to the photo-generated voltage produced by the non-shorted areas of the devices.

18. The method of claim 17, wherein the voltage of said electrical energy and the photo-generated voltage produced by the non-shorted areas of the devices offset each other such that current flow within the non-shorted areas of the device is substantially reduced or eliminated, while current continues to flow in the shunted portions of the device.

19. A method of passivating short circuit defects in a thin film large area photovoltaic module comprising a substrate electrode, an intermediate body including a plurality of continuous layers disposed atop said substrate and selected from the group consisting of dielectrics, semiconductors, and combinations thereof, and a top electrode disposed atop said intermediate body, said method comprising the steps of:

providing a solution of a passivation agent in contact with at least those portions of said electrode proximate said defects; and disposing a counter-electrode in electrical communication with said solution of said passivation agent;

providing a power supply in electrical communication with both said counter-electrode and said substrate electrode of said photovoltaic module for applying a potential between said substrate electrode and said counter-electrode;

applying electrical energy to said electrodes thereby activating said passivation agent proximate said defects so as to facilitate modification of the electrode material, whereby said defects regions are substantially electrically isolated from the remainder of said electrode material; and controlling the voltage and duration of the application of said electrical energy so as to ensure high selectivity of modification of the electrode material adjacent said defects, while leaving the electrode material adjacent non-defect areas substantially unmodified, wherein said voltage induces current within the device such that the ratio of the current flowing through said defects to the current flowing through the non-defect portions of the device is at least 4:1.

20. The method of claim 19, wherein said ratio is at least 6:1.

21. The method of claim 19, wherein said ratio is at least 8:1.

* * * * *